United States Patent
Jin et al.

(10) Patent No.: US 11,905,586 B2
(45) Date of Patent: Feb. 20, 2024

(54) LOW FRICTION WEAR FILM AND METHOD FOR PRODUCING THE SAME

(71) Applicants: AISIN CORPORATION, Kariya (JP); TOHKEN THERMO TECH CO., LTD, Neyagawa (JP)

(72) Inventors: Chengji Jin, Kariya (JP); Hodo Suzuki, Kariya (JP); Masaki Kajino, Nagoya (JP); Kazuya Kitamura, Osaka (JP); Naoyuki Omori, Osaka (JP)

(73) Assignees: AISIN CORPORATION, Kariya (JP); TOHKEN THERMO TECH CO., LTD, Neyagawa (JP)

( * ) Notice: Subject to any disclaimer, the term of this patent is extended or adjusted under 35 U.S.C. 154(b) by 129 days.

(21) Appl. No.: 17/240,075

(22) Filed: Apr. 26, 2021

(65) Prior Publication Data

US 2021/0340662 A1 Nov. 4, 2021

(30) Foreign Application Priority Data

Apr. 30, 2020 (JP) .................. 2020-080336

(51) Int. Cl.
*C23C 14/02* (2006.01)
*C23C 14/06* (2006.01)
*C23C 14/16* (2006.01)
*C23C 14/34* (2006.01)

(52) U.S. Cl.
CPC ........ *C23C 14/025* (2013.01); *C23C 14/0605* (2013.01); *C23C 14/0635* (2013.01); *C23C 14/165* (2013.01); *C23C 14/34* (2013.01)

(58) Field of Classification Search
None
See application file for complete search history.

(56) References Cited

U.S. PATENT DOCUMENTS 11,499,643 B2 * 11/2022 Stadlberger ........... C23C 28/048
2009/0202790 A1 8/2009 Eerden et al.

FOREIGN PATENT DOCUMENTS

| CN | 107400873 A | 11/2017 |
| JP | 2001-225412 A | 8/2001 |
| JP | WO 2019/025627 A1 | 2/2019 |
| JP | 2019-038018 A | 3/2019 |

OTHER PUBLICATIONS

Office Action dated Oct. 3, 2023, issued in corresponding Japanese patent application No. 2020-080336.

* cited by examiner

*Primary Examiner* — Daniel J. Schleis
(74) *Attorney, Agent, or Firm* — Oblon, McClelland, Maier & Neustadt, L.L.P.

(57) ABSTRACT

A low friction wear film includes a chromium layer provided on a surface of a metal substrate, a tungsten carbide layer provided on a surface of the chromium layer, and a diamond-like carbon layer as a top layer provided on a surface of the tungsten carbide layer. The tungsten carbide layer includes a chromium-tungsten carbide gradient layer and a tungsten carbide uniform layer. In the tungsten carbide layer, a tungsten-concentrated layer in which a tungsten simple substance is present is not provided at a boundary between the chromium-tungsten carbide gradient layer and the tungsten carbide uniform layer.

4 Claims, 9 Drawing Sheets

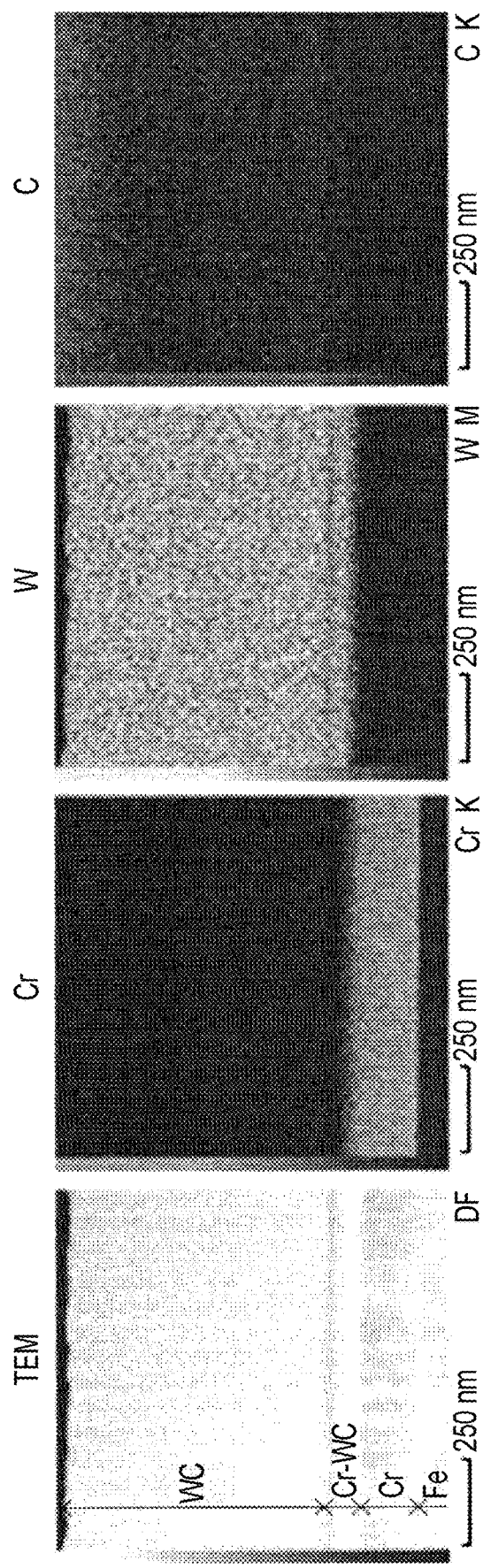

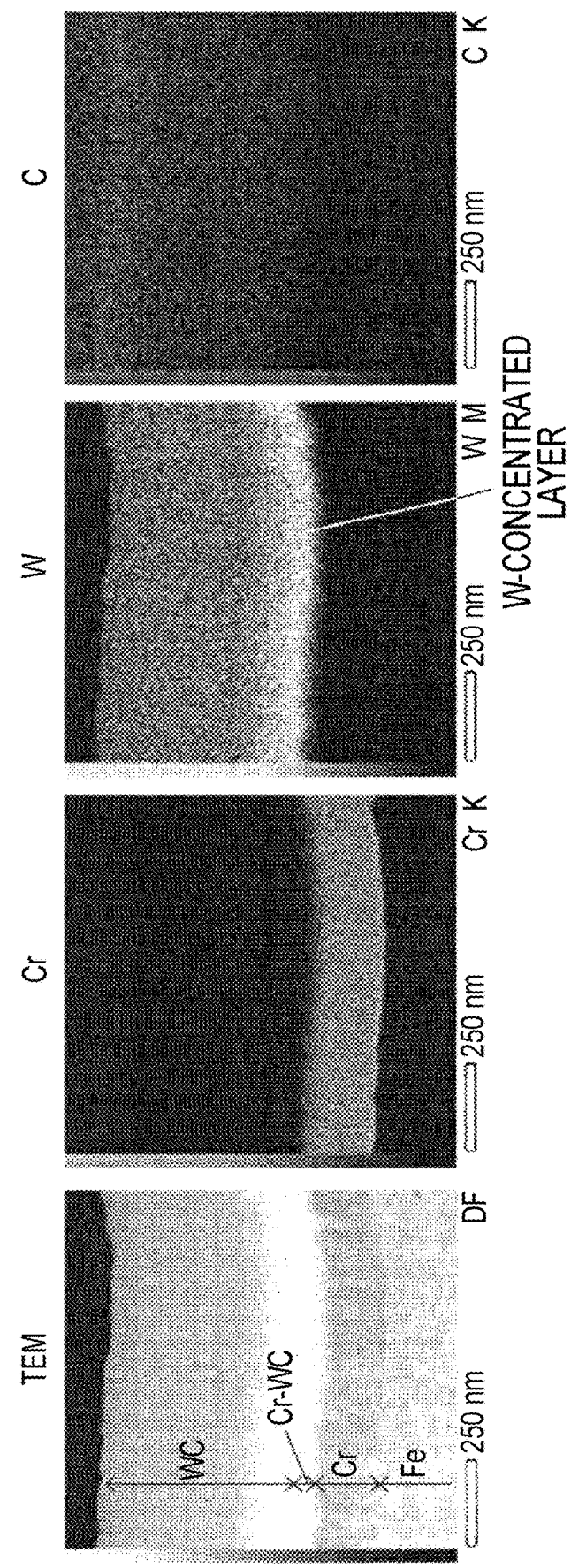

LOW FRICTION WEAR FILM AND METHOD FOR PRODUCING THE SAME

CROSS-REFERENCE TO RELATED APPLICATION

This application claims priority to Japanese Patent Application No. 2020-080336 filed on Apr. 30, 2020, incorporated herein by reference in its entirety.

BACKGROUND

1. Technical Field

The present disclosure relates to a low friction wear film and a method for producing the same. In particular, the present disclosure relates to a low friction wear film having a DLC layer as a top layer and having improved alkali resistance, and a method for producing the same.

2. Description of Related Art

DLC (diamond-like carbon) has high hardness, low friction coefficient, and wear resistance. Therefore, a film in which a DLC layer is formed as a top layer (outermost layer) is expected to be used in various fields as a low friction and low wear film, that is, a low friction wear film. For example, by forming a low friction wear film with a DLC layer as a top layer on the surface of a die casting mold, the life of the mold can be extended.

In forming a low friction low wear film having a DLC layer as a top layer (hereinafter, simply referred to as a low friction wear film) on the surface of a metal substrate, a chromium layer (Cr layer) and a layer (WC layer) containing tungsten carbide (WC) may be formed on the low friction wear film in order to improve adhesion. In this case, the Cr layer is formed on the surface of the metal substrate, the WC layer is formed on the surface of the Cr layer, and the DLC layer is formed on the surface of the WC layer. The Cr layer improves the adhesion to the substrate, and the WC layer improves the adhesion to the DLC layer.

Japanese Unexamined Patent Application Publication No. 2001-225412 (JP 2001-225412 A) discloses a low friction wear film in which a Cr layer, a Cr—WC gradient layer, and a DLC layer are formed in this order on the surface of a metal substrate. The Cr—WC gradient layer is formed such that the chromium content at the interface with the Cr layer is 100 wt %, the chromium content at the interface with the DLC layer is 0 wt %, and the composition ratio of Cr decreases and the composition ratio of WC increases from the Cr layer toward the DLC layer. According to the low friction wear film disclosed in JP 2001-225412A, the adhesion can be further improved.

SUMMARY

Problem to be Solved by the Disclosure

A low friction wear film having a DLC layer as a top layer is needed to be further improved from the viewpoint of alkali resistance. Therefore, the present disclosure provides a low friction wear film having improved alkali resistance and a method for producing the same.

The first aspect of the present disclosure is a low friction wear film. The low friction wear film includes a chromium layer provided on a surface of a metal substrate, a tungsten carbide layer provided on a surface of the chromium layer, and a diamond-like carbon layer as a top layer provided on a surface of the tungsten carbide layer. The tungsten carbide layer includes a chromium-tungsten carbide gradient layer and a tungsten carbide uniform layer. The chromium-tungsten carbide gradient layer contains chromium and tungsten carbide, and has a gradient composition in which the composition ratio of the chromium decreases and the composition ratio of the tungsten carbide increases as the distance from the chromium layer in the thickness direction increases. The tungsten carbide uniform layer is made of tungsten carbide provided on the surface of the chromium-tungsten carbide gradient layer. In the tungsten carbide layer, a tungsten-concentrated layer in which a tungsten simple substance is present is not provided at a boundary between the chromium-tungsten carbide gradient layer and the tungsten carbide uniform layer.

Low friction wear films have a Cr layer formed on the surface of the metal substrate, a WC layer including a Cr—WC gradient layer formed on the surface of the Cr layer and a WC uniform layer formed on the surface of the Cr—WC gradient layer, and a DLC layer formed on the surface of the WC layer, and a W-concentrated layer in which a tungsten (W) simple substance is present is formed at the boundary between the Cr—WC gradient layer and the WC uniform layer. The presence of such a W-concentrated layer causes a decrease in alkali resistance. On the other hand, with the above configuration, since the tungsten-concentrated layer is not formed at the boundary between the chromium-tungsten carbide gradient layer and the tungsten carbide uniform layer, the alkali resistance is high. Therefore, according to the above configuration, it is possible to provide a low friction wear film having improved alkali resistance.

In the low friction wear film, the ratio of the atomic concentration of tungsten to the total of the atomic concentration of the tungsten and the atomic concentration of carbon in the tungsten carbide layer may be 50% or less. With the above configuration, the formation of the tungsten-concentrated layer can be suppressed by adjusting the ratio to 50% or less. When an excess carbon component is present in the tungsten carbide layer, a tungsten carbide-carbon layer is formed in the tungsten carbide layer by the carbon component and the tungsten carbide component.

The second aspect of the present disclosure is a method for producing a low friction wear film. The low friction wear film includes: a chromium layer that is provided on a surface of a metal substrate; a tungsten carbide layer that is provided on a surface of the chromium layer, the tungsten carbide layer including a chromium-tungsten carbide gradient layer and a tungsten carbide uniform layer, the chromium-tungsten carbide gradient layer containing chromium and tungsten carbide and having a gradient composition in which a composition ratio of the chromium decreases and a composition ratio of the tungsten carbide increases as a distance from the chromium layer in a thickness direction increases, the tungsten carbide uniform layer being made of tungsten carbide provided on a surface of the chromium-tungsten carbide gradient layer; a diamond-like carbon layer as a top layer that provided on a surface of the tungsten carbide layer. The method includes: as a chromium layer deposition step, depositing the chromium layer by causing inert gas ions to collide with a chromium target made of chromium placed in a vacuum chamber to cause chromium atoms sputtered from the chromium target to adhere to the surface of the metal substrate; as a chromium-tungsten carbide gradient layer deposition step, depositing the chromium-tungsten carbide gradient layer by causing inert gas ions to collide with the chromium target and a tungsten carbide target made of tungsten carbide placed in the vacuum chamber to cause chromium atoms sputtered from the chromium target and tungsten carbide component sputtered from the tungsten carbide target to adhere to the surface of the chromium layer; as a tungsten carbide uniform layer deposition step, depositing the tungsten carbide uniform layer by causing inert gas ions to collide with the tungsten carbide target placed in the vacuum chamber to cause the tungsten carbide component sputtered from the tungsten carbide target to adhere to the surface of the chromium-tungsten carbide gradient layer; as a hydrocarbon ionization step, introducing a hydrocarbon gas into the vacuum chamber and ionizing the introduced hydrocarbon gas; and depositing the diamond-like carbon layer by causing hydrocarbon ionized in the hydrocarbon ionization step to adhere to the surface of the tungsten carbide uniform layer. The hydrocarbon ionization step is started before the tungsten carbide uniform layer deposition step is carried out.

With to the above configuration, the hydrocarbon ionization step is performed before the tungsten carbide uniform layer deposition step is carried out. Therefore, ionized hydrocarbons are already present in the vacuum chamber at the start of the tungsten carbide uniform layer deposition step. Thus, excess tungsten generated in the tungsten carbide uniform layer deposition step is bonded with ionized hydrocarbons to form tungsten carbide and thereby consumed, so that the formation of the tungsten-concentrated layer at the boundary between the chromium-tungsten carbide gradient layer and the tungsten carbide uniform layer is suppressed. Therefore, it is possible to produce a low friction wear film in which the tungsten-concentrated layer is not formed at the boundary between the chromium-tungsten carbide gradient layer and the tungsten carbide uniform layer.

In the method for producing a low friction wear film, the hydrocarbon ionization step may be started at the same time as the start of the chromium-tungsten carbide gradient layer deposition step. With the above configuration, since the ionized hydrocarbon is allowed to be sufficiently present in the vacuum chamber at the start of the tungsten carbide uniform layer deposition step, almost all of the excess tungsten generated in the WC uniform layer deposition step can be bonded with the ionized hydrocarbon, thereby suppressing formation of the tungsten-concentrated layer due to the excess tungsten generated in the initial stage of deposition of the tungsten carbide uniform layer deposition step. In addition, excess tungsten generated in the final stage of deposition of the chromium-tungsten carbide gradient layer deposition step is bonded with the ionized hydrocarbon to form tungsten carbide, thereby suppressing formation of the tungsten-concentrated layer due to the excess tungsten generated in the final stage of deposition of the chromium-tungsten carbide gradient layer deposition step.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 8A is a TEM image showing a cross section from a Cr layer to a WC layer of the low friction wear film formed on a sample prepared in Example 1;

FIG. 8B is a mapping image in which the Cr component in the TEM image of FIG. 8A is mapped;

FIG. 8C is a mapping image in which the W component in the TEM image of FIG. 8A is mapped;

FIG. 8D is a mapping image in which the C component in the TEM image of FIG. 8A is mapped;

FIG. 9A is a TEM image showing a cross section from a Cr layer to a WC layer of the low friction wear film formed on a sample prepared in Comparative Example 1;

FIG. 9B is a mapping image in which the Cr component in the TEM image of FIG. 9A is mapped;

FIG. 9C is a mapping image in which the W component in the TEM image of FIG. 9A is mapped; and FIG. 9D is a mapping image in which the C component in the TEM image of FIG. 9A is mapped.

DETAILED DESCRIPTION OF EMBODIMENTS

Figure 1:
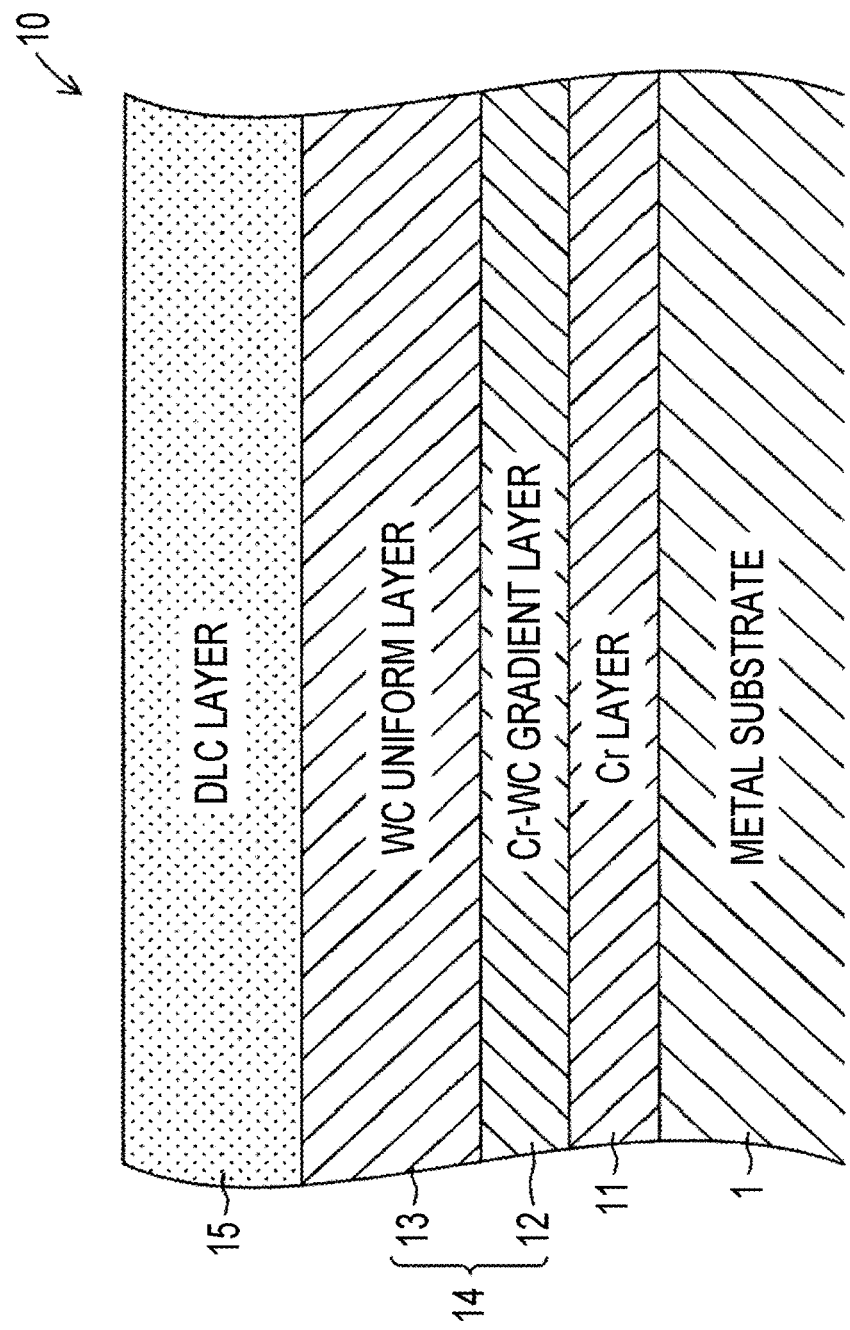
FIG. 1 shows a schematic cross-sectional view of a portion of a low friction wear film according to the present embodiment.

FIG. 1 shows a schematic cross-sectional view of a portion of a low friction wear film according to the present embodiment. As shown in FIG. 1, a low friction wear film 10 according to the present embodiment includes a Cr layer 11, a WC layer 14 having a Cr—WC gradient layer 12 and a WC uniform layer 13, and a DLC layer 15 as a top layer, and these layers are formed on a surface of a metal substrate 1 in this order.

The Cr layer 11 is a layer made of chromium (Cr). The Cr layer 11 is formed on the surface of the metal substrate 1. As the metal substrate 1, an iron substrate is preferably used from the viewpoint of adhesion to the Cr layer. Examples of the iron substrate include, but are not limited to, alloy tool steels (SKD, SKS, or the like) used for molds and tools. Further, the Cr layer 11 is typically deposited on the surface of the metal substrate 1 by sputtering.

The Cr—WC gradient layer 12 is formed on the surface of the Cr layer 11. The Cr—WC gradient layer 12 is configured to have a gradient composition in which the composition ratio of Cr and tungsten carbide (WC) is inclined in the thickness direction. Specifically, the Cr—WC gradient layer 12 is formed such that the composition ratio of Cr decreases and the composition ratio of WC increases with distance from the Cr layer 11 in the thickness direction (the thickness direction of the low friction wear film). The mode of changing the composition ratio of Cr and WC is not particularly limited, and may be a primary change, a secondary change, or any other change.

The Cr—WC gradient layer 12 is typically deposited on the surface of the Cr layer 11 by sputtering. At this time, the Cr—WC gradient layer 12 can be formed by adjusting the voltage ratio between the voltage applied to the chromium (Cr) target used for sputtering and the voltage applied to the tungsten carbide (WC) target.

The WC uniform layer 13 is formed on the surface of the Cr—WC gradient layer 12. The WC uniform layer 13 is a layer made of WC. The WC uniform layer 13 is typically deposited on the surface of the Cr—WC gradient layer 12 by sputtering.

The WC layer 14 has the Cr—WC gradient layer 12 described above and the WC uniform layer 13. The WC layer 14 may include a WC—C layer in which a trace amount of carbon (C) atoms is mixed in the WC. Such a WC—C layer may be formed on a surface of the WC uniform layer 13, that is, between the WC uniform layer 13 and the DLC layer 15.

Further, a W-concentrated layer in which a tungsten (W) simple substance is present is not formed at the boundary between the Cr—WC gradient layer 12 and the WC uniform layer 13. That is, the WC layer 14 has a Cr—WC gradient layer 12 and a WC uniform layer 13, and is configured such that a W-concentrated layer is not formed at the boundary between the Cr—WC gradient layer 12 and the WC uniform layer 13. The effect of not forming the W-concentrated layer in this way and the method for producing the same will be described later.

The DLC layer 15 (diamond-like carbon layer) is formed on the surface of the WC layer 14. The DLC layer 15 is configured to the top layer of the low friction wear film 10 according to the present embodiment. The DLC layer 15 is an amorphous carbon film having both a diamond $sp^3$ bond and a graphite $sp^2$ bond as a skeleton structure of carbon atoms. Therefore, the DLC layer 15 has properties similar to diamond and graphite. Therefore, by providing the DLC layer 15 as the top layer, a low friction and low wear film having high hardness can be formed. The DLC layer 15 is deposited on the surface of the WC layer 14 by, for example, a plasma CVD method.

As described above, the low friction wear film 10 according to the present embodiment includes the Cr layer 11, the WC layer 14 having the Cr—WC gradient layer 12 and the WC uniform layer 13, and the DLC layer 15. The W-concentrated layer is not formed at the boundary between the Cr—WC gradient layer 12 and the WC uniform layer 13, as described above. On the other hand, in the low friction wear film according to the related art, a W-concentrated layer is formed at the boundary between the Cr—WC gradient layer and the WC uniform layer. This will be described below.

Figure 2:
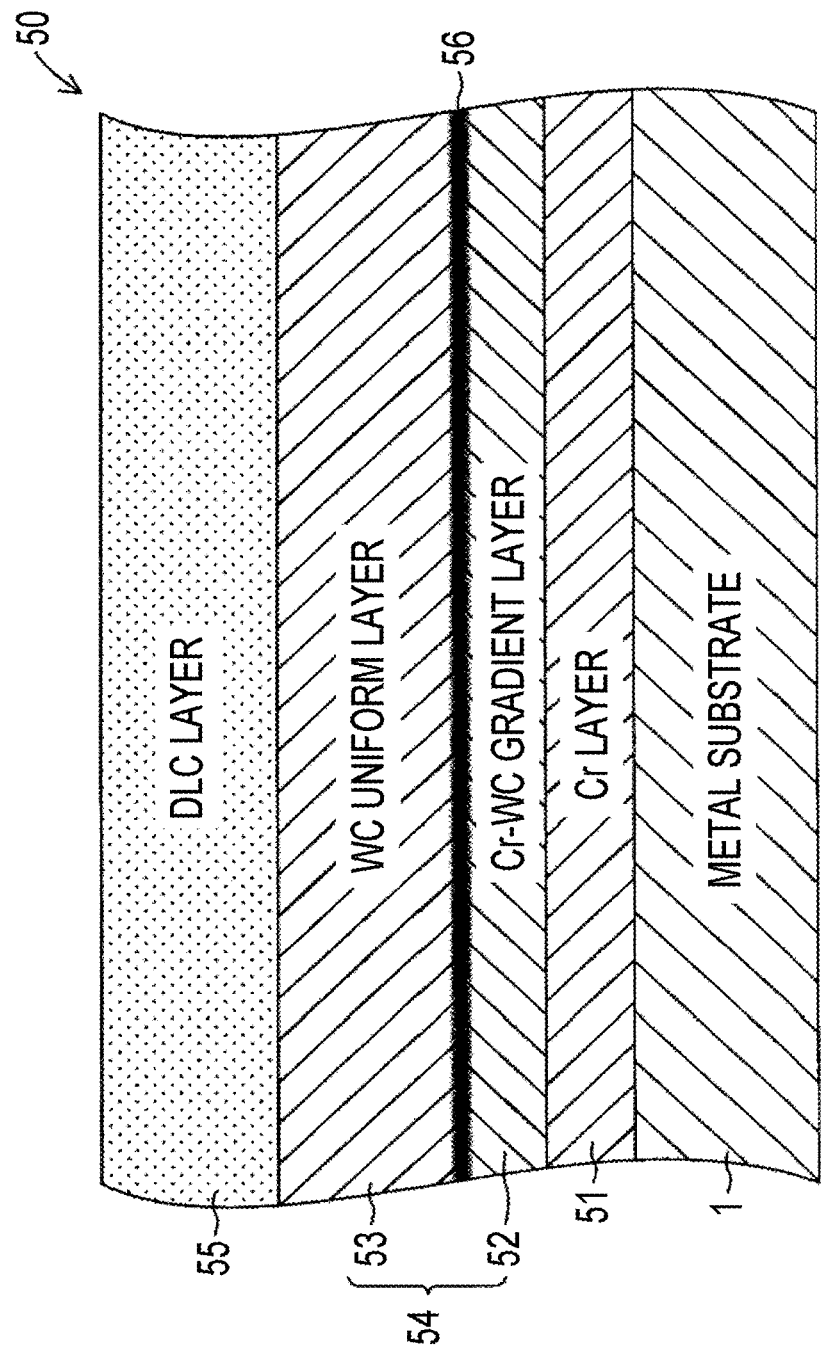
FIG. 2 shows a schematic cross-sectional view of a portion of a low friction wear film according to a related art.

FIG. 2 shows a schematic cross-sectional view of a portion of a low friction wear film 50 according to a related art. As shown in FIG. 2, the low friction wear film 50 according to the related art, similar to the low friction wear film 10 according to the present embodiment, has a Cr layer 51 formed on the surface of the metal substrate 1, a WC layer 54 including a Cr—WC gradient layer 52 formed on the surface of the Cr layer 51 and a WC uniform layer 53 formed on the surface of the Cr—WC gradient layer 52, and a DLC layer 55 formed on the surface of the WC layer 54. Further, a W-concentrated layer 56 is formed in the low friction wear film 50 according to the related art. The W-concentrated layer 56 is formed at the boundary between the Cr—WC gradient layer 52 and the WC uniform layer 53.

The reason why such a W-concentrated layer 56 is formed is as follows. Although the WC component in the Cr—WC gradient layer and the WC component constituting the WC uniform layer are generally supplied into the layers by sputtering from the WC target, it has been found that the amount of the W component (tungsten component) in the WC component sputtered from the WC target is larger than the amount of the C component (carbon component). That is, the sputtering rate of W is higher than the sputtering rate of C. Therefore, at the final stage of deposition of the Cr—WC gradient layer 52 and the initial stage of deposition of the WC uniform layer 53, a layer in which W simple substance is present is formed by the excess W component. The layer in which W simple substance is present formed in this way is formed as a W-concentrated layer at the boundary between the Cr—WC gradient layer 52 and the WC uniform layer 53. It is considered that at the initial stage of deposition of the Cr—WC gradient layer 52, the composition ratio of WC is small and thus the W-concentrated layer is not formed. Further, it is considered that at the final stage of deposition of the WC uniform layer 53, the W component and the C component sputtered from the WC target are about the same amount and thus the W-concentrated layer is not formed.

In a case where a W-concentrated layer is formed at the boundary between the Cr—WC gradient layer and the WC uniform layer, the film may peel off starting from the W-concentrated layer. The reason for this will be described below. When the low friction wear film 10 according to the present embodiment shown in FIG. 1 and the low friction wear film 50 according to the related art shown in FIG. 2 are used under harsh conditions, cracks may occur on the film surface. In addition, defects such as pinholes may occur in the film during deposition, and the defects may be exposed to the surface. When the W-concentrated layer 56 is formed as in the low friction wear film 50 according to the related art, the cracks or defects may reach the W-concentrated layer 56.

When the low friction wear film 50 according to the related art is continuously used with the cracks or defects reaching the W-concentrated layer 56, oxygen in the atmosphere (for example, air) enters the W-concentrated layer 56 through the cracks or defects, and the entered oxygen comes into contact with W in the W-concentrated layer 56 to cause the following oxidation reaction. $2W+3O_2 \rightarrow 2\ WO_3$ Further, when the tungsten oxide produced by the above reaction comes into contact with an alkaline solution (sodium hydroxide), the following reaction occurs. $WO_3+2NaOH$ $Na_2WO_4+H_2O$ Sodium tungstate produced by the above reaction dissolves in the alkaline solution. That is, tungstic acid is soluble in the alkaline solution. Therefore, the W-concentrated layer 56 elutes. When the W-concentrated layer 56 elutes, the portions (WC uniform layer 53 and DLC layer 55) formed on the W-concentrated layer 56 are peeled off.

Figure 3:
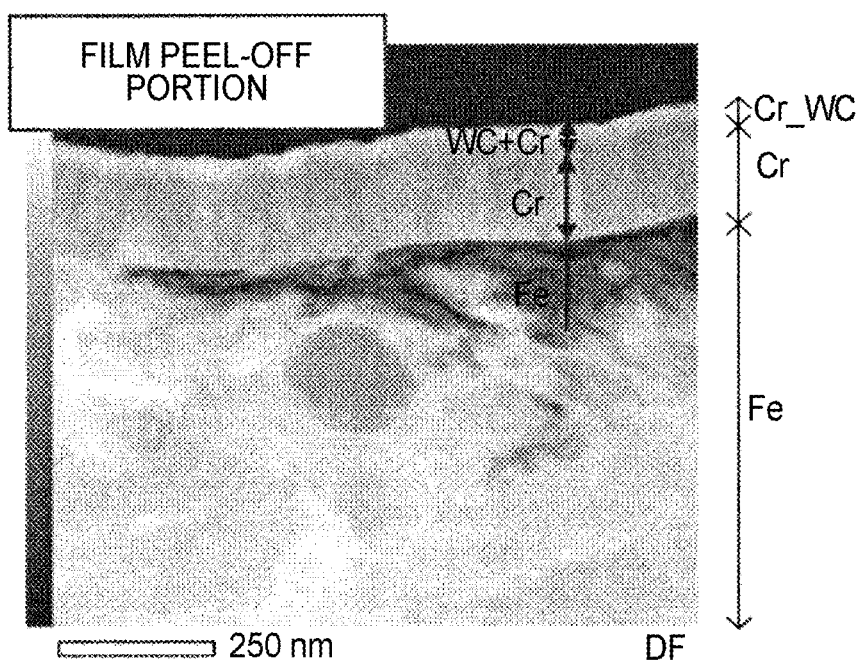
FIG. 3 shows a TEM image of a cross section of a portion left at a peeled portion in a low friction wear film according to a related art.
Figures 4A, 4B, 4C:
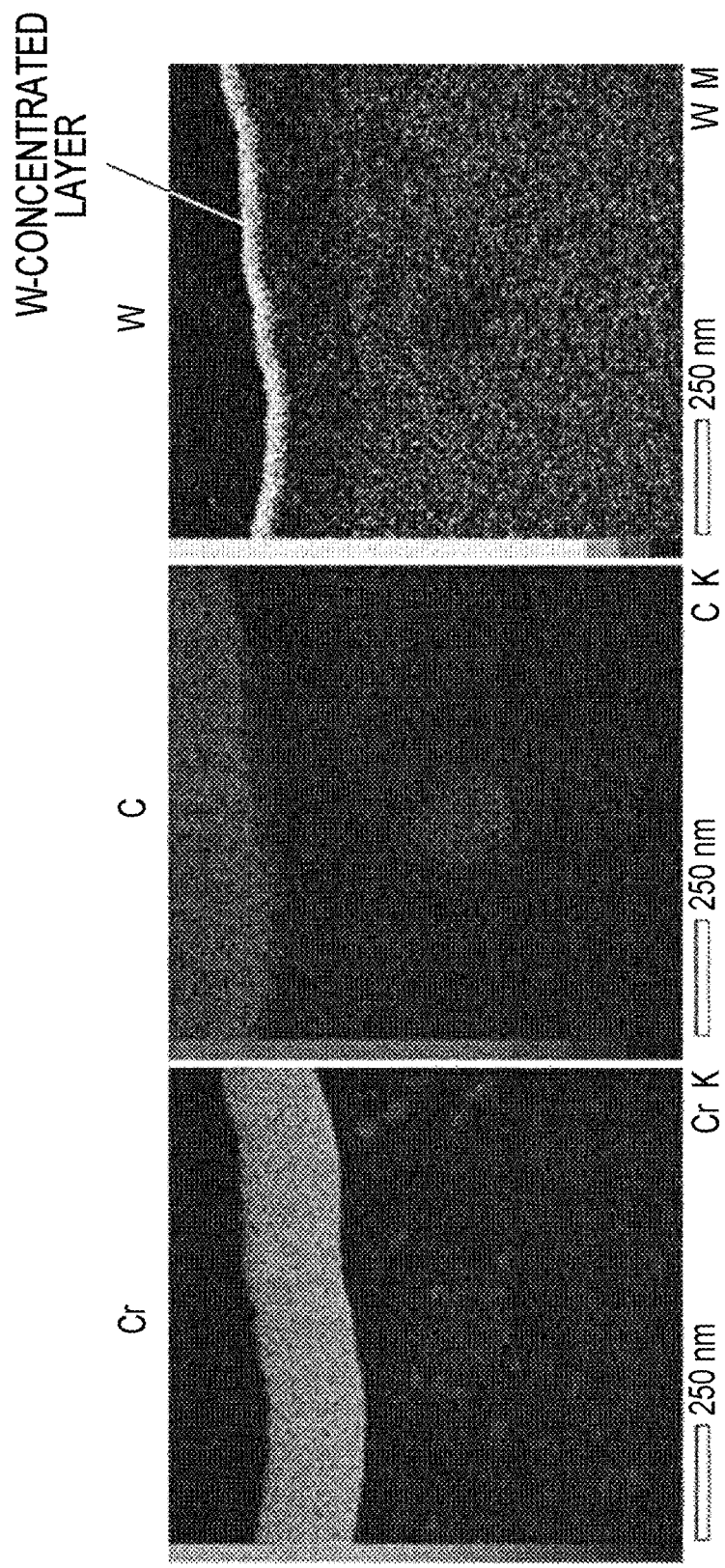
FIG. 4A shows a mapping image in which the Cr component in the TEM image of FIG. 3 is mapped.
FIG. 4B shows a mapping image in which the C component in the TEM image of FIG. 3 is mapped.
FIG. 4C shows a mapping image in which the W component in the TEM image of FIG. 3 is mapped.

FIG. 3 is a TEM image of a cross section of a portion left at a peeled portion in a low friction wear film according to a related art. As shown in FIG. 3, the layers above the Cr—WC gradient layer (WC uniform layer and DLC layer) are peeled off, and just the Cr layer and the Cr—WC gradient layer are left on the surface of the metal substrate (Fe). Further, FIGS. 4A to 4C are mapping images obtained by mapping the TEM image of FIG. 3 of the Cr component, the C component, and the W component, respectively. FIG. 4A is a mapping image of Cr, FIG. 4B is a mapping image of C, and FIG. 4C is a mapping image of W. As is well shown in FIG. 4C, the W component is detected on the surface of the portion left at the peeled portion, and the C component is not detected in the portion where the W component is detected. Therefore, it was confirmed that a W-concentrated layer was formed at the boundary between the Cr—WC gradient layer and the WC uniform layer, and peeling occurred starting from the portion where the W-concentrated layer was formed.

Such a peeling phenomenon remarkably occurs, for example, when the low friction wear film 50 according to the related art is coated on the surface of a die casting mold. Since the use environment of the die casting mold is severe, cracks may occur in the DLC layer 55 of the top coat, and when the die casting mold is continuously used in this state, the cracks reach the W-concentrated layer 56. Then, as described above, W in the W-concentrated layer 56 is oxidized. Further, in order to remove aluminum and the like adhering to the die casting mold, the die casting mold is immersed in an alkaline cleaning solution. Then, as described above, sodium tungstate is generated, and thus the W-concentrated layer 56 is eluted into the alkaline cleaning solution. As a result, the DLC layer 55 and the WC uniform layer 53 are peeled off.

Therefore, according to the low friction wear film 50 according to the related art, since the W-concentrated layer 56 is formed at the boundary between the Cr—WC gradient layer 52 and the WC uniform layer 53, the alkali resistance is low and the corrosion resistance is poor. On the other hand, according to the low friction wear film 10 according to the present embodiment, the WC layer 14 is configured such that the W-concentrated layer is not formed at the boundary between the Cr—WC gradient layer 12 and the WC uniform layer 13. Therefore, even when defects such as cracks are formed in the film, tungsten oxide is not formed in the WC layer 14, and therefore, even when immersed in an alkaline solution, peeling of the DLC layer 15 and the WC uniform layer 13 is suppressed.

Figure 5:
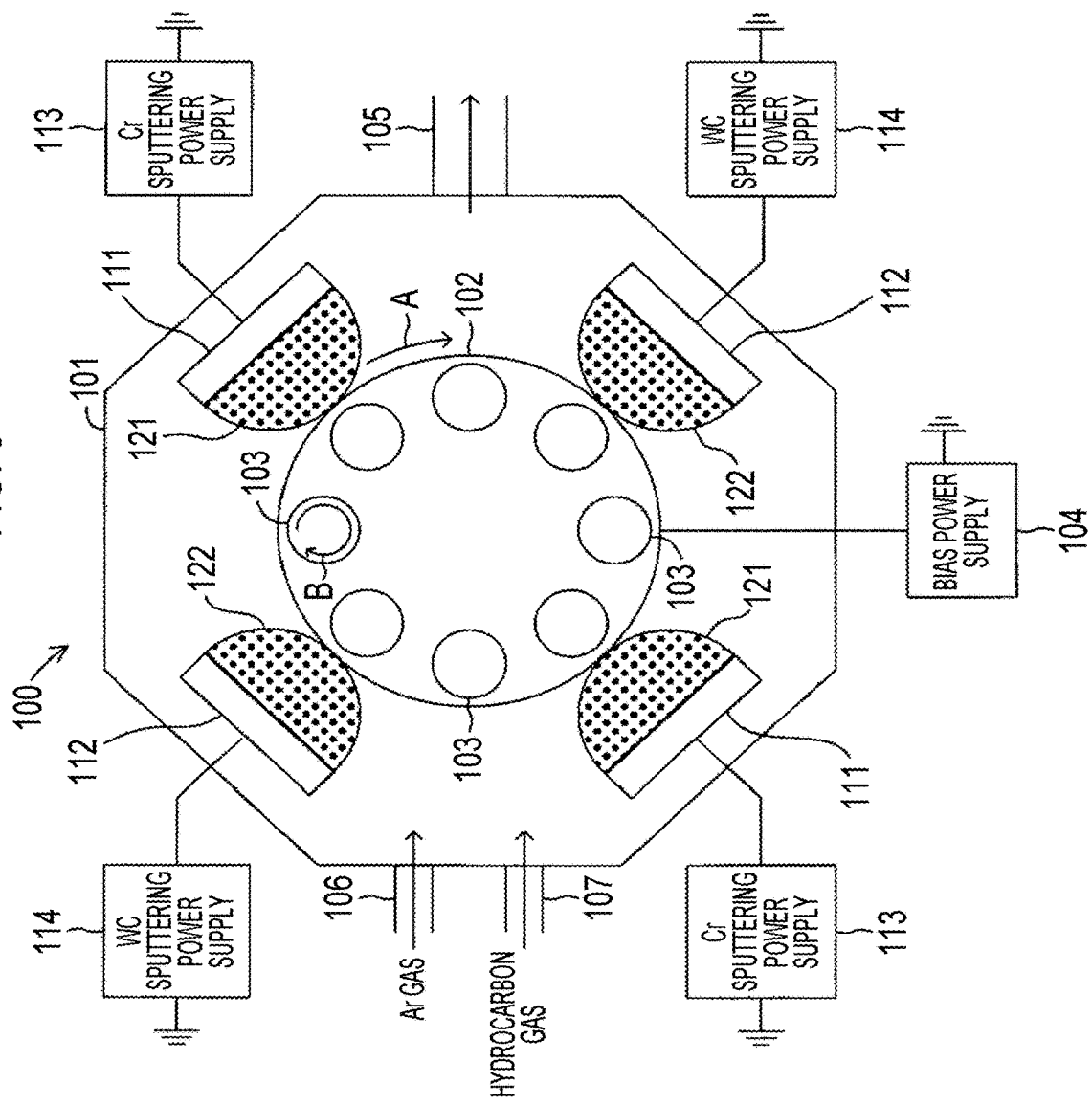
FIG. 5 is a cross-sectional view schematically showing a sputtering apparatus for producing the low friction wear film according to the present embodiment from a planar direction (upward direction)

Next, a method for producing the low friction wear film 10 according to the present embodiment will be described. FIG. 5 is a cross-sectional view schematically showing a sputtering apparatus 100 for producing the low friction wear film 10 according to the present embodiment from a planar direction (upward direction). As shown in FIG. 5, the sputtering apparatus 100 includes a vacuum chamber 101 having an internal space. A rotary table 102 is arranged in the vacuum chamber 101.

As shown in FIG. 5, the rotary table 102 has a circular planar shape. On the upper surface of the rotary table 102, a plurality of (eight in FIG. 5) disk-shaped substrate holders 103 are arranged at regular intervals in the circumferential direction of the rotary table 102. The central axis of each substrate holder 103 is parallel to the central axis of the rotary table 102. Then, a plurality of substrates (iron substrate in the present embodiment) is placed and held on the substrate holders 103, respectively.

The rotary table 102 is configured to rotate (spin) in a predetermined rotation direction (for example, the clockwise rotation direction indicated by the arrow A in FIG. 5) around the central axis of the rotary table 102 by drive means (not shown). Further, the substrate holders 103 provided on the rotary table 102 is configured to rotate (spin) in a predetermined rotation direction (for example, the clockwise rotation direction indicated by the arrow B in FIG. 5) around the central axis of the rotary table 102 by drive means (not shown). Therefore, as the rotary table 102 and the substrate holders 103 rotate together, the iron substrates on the substrate holders 103 spin in an orbital motion. Further, a bias power supply 104 is connected to the rotary table 102. The bias power supply 104 is configured to apply a negative bias voltage to the rotary table 102, the substrate holders 103, and the iron substrates held by the substrate holders 103.

Further, the vacuum chamber 101 is provided with an exhaust port 105, an Ar gas introduction port 106, and a hydrocarbon gas introduction port 107. The exhaust port 105 is connected to a vacuum pump, the Ar gas introduction port 106 is connected to an Ar gas source, and the hydrocarbon gas introduction port 107 is connected to a hydrocarbon gas source. Examples of the hydrocarbon gas source include an acetylene gas source and a methane gas source.

Further, a pair of Cr targets 111 and a pair of WC targets 112 are placed in the vacuum chamber 101. The Cr targets 111 are each made of chromium, and as shown in FIG. 5, are disposed facing each other in the radial direction of the rotary table 102 with the rotary table 102 interposed between the Cr targets 111 as viewed from the plane direction. The WC targets 112 are each made of tungsten carbide, and as shown in FIG. 5, are disposed facing each other in the radial direction of the rotary table 102 with the rotary table 102 interposed between the WC targets 112 as viewed from the plane direction. The facing directions of the Cr targets 111 and the facing directions of the WC targets 112 are substantially perpendicular to each other. Therefore, the targets are arranged at 90-degree intervals in the circumferential direction of the rotary table 102. Cr sputtering power supplies 113 disposed outside the vacuum chamber 101 are connected to the Cr targets 111, respectively. WC sputtering power supplies 114 disposed outside the vacuum chamber 101 are connected to the WC targets 112, respectively. A negative voltage (sputtering voltage) is applied to these targets by the sputtering power supplies.

When the low friction wear film 10 according to the present embodiment is produced by using the sputtering apparatus 100 having the above configuration, first, an iron substrate is held by the substrate holder 103. Next, the vacuum chamber 101 is sealed, and the internal space of the vacuum chamber 101 is depressurized to a predetermined low pressure by operating the vacuum pump connected to the exhaust port 105. Further, the rotary table 102 and each substrate holder 103 are rotated so that the iron substrate held by the substrate holder 103 spin and orbit. By causing the iron substrate to spin and orbit in the vacuum chamber 101, the low friction wear film 10 can be uniformly deposited on the surface of the iron substrate.

Next, a Cr layer deposition step is carried out. In the Cr layer deposition step, while the internal pressure of the vacuum chamber 101 is maintained at a predetermined low pressure, an Ar gas as an inert gas is introduced into the vacuum chamber 101 from the Ar gas introduction port 106 connected to the Ar gas source, and the Cr sputtering power supply 113 is controlled so that a predetermined negative high voltage is applied to the Cr target 111. As a result, electric discharge is generated from the Cr target 111, and plasma 121 is generated on the front surface of the Cr target 111 (the surface facing the rotary table 102). The Ar gas is ionized in the plasma 121, and the ionized Ar gas ($Ar^+$) collides with the Cr target 111 charged with a negative voltage, so that Cr atoms are sputtered from the Cr target 111. Then, the sputtered Cr atoms adhere to the surface of the iron substrate held by the substrate holder 103, so that the Cr layer 11 is formed (deposited) on the surface of the iron substrate.

After a lapse of a predetermined time or after the thickness of the Cr layer 11 reaches a predetermined thickness, the Cr layer deposition step is completed, and then the Cr—WC gradient layer deposition step is carried out. In the Cr—WC gradient layer deposition step, a negative voltage is applied to the Cr target 111 and at the same time a negative voltage is applied to the WC target 112 by the WC sputtering power supply 114 to generate plasma 122 on the front surface of the WC target 112. Further, at the same time as the start of the Cr—WC gradient layer deposition step, a hydrocarbon gas such as acetylene is introduced into the vacuum chamber 101 from the hydrocarbon gas introduction port 107 connected to the hydrocarbon gas source. The hydrocarbon gas introduced into the vacuum chamber 101 is ionized in the plasma 121 and the plasma 122 (hydrocarbon ionization step). That is, the hydrocarbon ionization step is started at the same time as the start of the Cr—WC gradient layer deposition step. In the related art, the introduction of the hydrocarbon gas in a hydrocarbon gas ionization step is started at the same time as the start of the WC uniform layer deposition step described later.

When the Cr—WC gradient layer deposition step is carried out, Ar⁺ in the plasma 121 formed on the front surface of the Cr target 111 collides with the Cr target 111, and Cr atoms are sputtered from the Cr target 111, and at the same time, Ar⁺ in the plasma 122 formed on the front surface of the WC target 112 collides with the WC target 112, and the WC component is sputtered from the WC target 112. Here, the WC component sputtered from the WC target 112 includes WC particles, W atoms, and C atoms. The Cr atom sputtered from the Cr target 111 and the WC component sputtered from the WC target 112 adhere to the surface of the Cr layer 11 formed on the surface of the iron substrate.

Further, in the Cr—WC gradient layer deposition step, the Cr sputtering power supply 113 and the WC sputtering power supply 114 are controlled so that the negative voltage applied to the Cr target 111 gradually decreases in the negative direction with the lapse of time, and the negative voltage applied to the WC target 112 gradually increases in the negative direction with the lapse of time. Therefore, the amount of Cr atoms sputtered from the Cr target 111 gradually decreases, and the amount of WC component sputtered from the WC target 112 gradually increases. As a result, in the Cr—WC gradient layer deposition step, the Cr—WC gradient layer 12 which is a film in which the composition ratio of Cr and WC is inclined is formed (deposited) on the surface of the Cr layer 11. The Cr—WC gradient layer 12 has a gradient composition such that the composition ratio of Cr decreases and the composition ratio of WC increases as the distance from the Cr layer 11 in the thickness direction increases.

Here, in the sputtering of the WC target 112, the amount of W atoms in the WC component sputtered from the WC target 112 is larger than the amount of C atoms as described above. Therefore, a W-concentrated layer may be formed due to excess W atoms. In particular, since the WC component sputtered from the WC targets 112 increases at the final stage of the Cr—WC gradient layer deposition step, excess W atoms are generated at the final stage of the deposition. Therefore, in the related art, a W-concentrated layer was formed at the final stage of deposition of the Cr—WC gradient layer 12. On the other hand, according to the present embodiment, the hydrocarbon ionization step is started at the start stage of the formation of the Cr—WC gradient layer 12, the hydrocarbon gas is introduced from the hydrocarbon gas introduction port 107, and the introduced hydrocarbon gas is ionized in the respective plasmas 121, 122 as described above. Then, the ionized hydrocarbons are bonded with the excess W component to form WC. Since the excess W is consumed for the formation of WC in this way, the formation of the W-concentrated layer at the final stage of deposition of the Cr—WC gradient layer 12 is suppressed.

The Cr—WC gradient layer deposition step is completed when the negative voltage applied to the Cr target 111 drops to a predetermined voltage. Thereafter, a WC uniform layer deposition step is carried out. In the WC uniform layer deposition step, the application of the negative voltage to the Cr target 111 is stopped, and the negative voltage applied to the WC target 112 is maintained at a predetermined voltage. As a result, the WC component is sputtered solely from the WC target 112. The WC component sputtered in this way adheres to the surface of the Cr—WC gradient layer 12 formed on the iron substrate. As a result, the WC uniform layer 13 made of WC is formed (deposited) on the surface of the Cr—WC gradient layer 12.

Further, in the WC uniform layer deposition step, the hydrocarbon ionization step is continuously carried out from the Cr—WC gradient layer deposition step, and the hydrocarbon gas is continuously introduced from the hydrocarbon gas introduction port 107. Here, as described above, the amount of W atoms in the WC component sputtered from the WC target 112 is larger than the amount of C atoms. Therefore, in the related art, the W-concentrated layer is formed by the excess W component generated at the initial stage of deposition of the WC uniform layer 13. On the other hand, in the present embodiment, the hydrocarbon ionization step is started before the WC uniform layer deposition step is carried out, and at the start of the WC uniform layer deposition step, the plasma 122 sufficiently contains the ionized hydrocarbon. Therefore, the excess W generated at the initial stage of the WC uniform layer deposition step is bonded with the ionized hydrocarbon to form WC. That is, the excess W generated at the initial stage of deposition of the WC uniform layer is bonded with the hydrocarbon ions generated in the hydrocarbon ionization step to form WC and thereby consumed. Therefore, the formation of the W-concentrated layer at the initial stage of deposition of the WC uniform layer 13 is suppressed. In this way, the formation of the W-concentrated layer at the final stage of deposition of the Cr—WC gradient layer 12 and the initial stage of deposition of the WC uniform layer 13 is suppressed, so that a W-concentrated layer is not formed at the boundary between the Cr—WC gradient layer 12 and the WC uniform layer 13.

After a lapse of a predetermined time or after the thickness of the WC uniform layer 13 reaches a predetermined thickness, the WC uniform layer deposition step is completed, and then a DLC layer deposition step is carried out. In the DLC layer deposition step, the application of the negative voltage to the WC target 112 is stopped. Further, at a predetermined flow rate, the hydrocarbon gas is introduced from the hydrocarbon gas introduction port 107 into the vacuum chamber 101, and the bias power supply 104 connected to the rotary table 102 applies a predetermined negative voltage to the substrate holder 103 and the iron substrate held on the substrate holder 103. As a result, plasma is generated around the iron substrate, and the hydrocarbon gas introduced into the vacuum chamber 101 is ionized by the plasma. That is, the hydrocarbon ionization step is continued even in the DLC layer deposition step. The hydrocarbon ionized in this way adheres to the surface of the WC uniform layer 13 deposited on the iron substrate as DLC. In this way, the DLC layer 15 is deposited on the surface of the WC uniform layer 13 (that is, on the surface of the WC layer 14) by the plasma CVD method.

Through the above steps, the low friction wear film 10 according to the present embodiment is produced. It should be noted that the above steps are just the steps needed for the description of the present disclosure, and other steps may be added in the actual production. For example, before the Cr layer deposition step, the cleaning step may be performed by applying a negative voltage to the iron substrate by the bias power supply 104 to cause $Ar^+$ to collide with the iron substrate. Further, in each deposition step, a predetermined voltage may be applied to the iron substrate by the bias power supply 104 to improve film quality. Furthermore, the sputtering apparatus 100 shown in FIG. 5 schematically shows just a structure necessary for the description of the present disclosure, and an actual production apparatus may have other structures. For example, the sputtering apparatus 100 may be used as a magnetron sputtering apparatus to improve the deposition rate.

Figure 6:
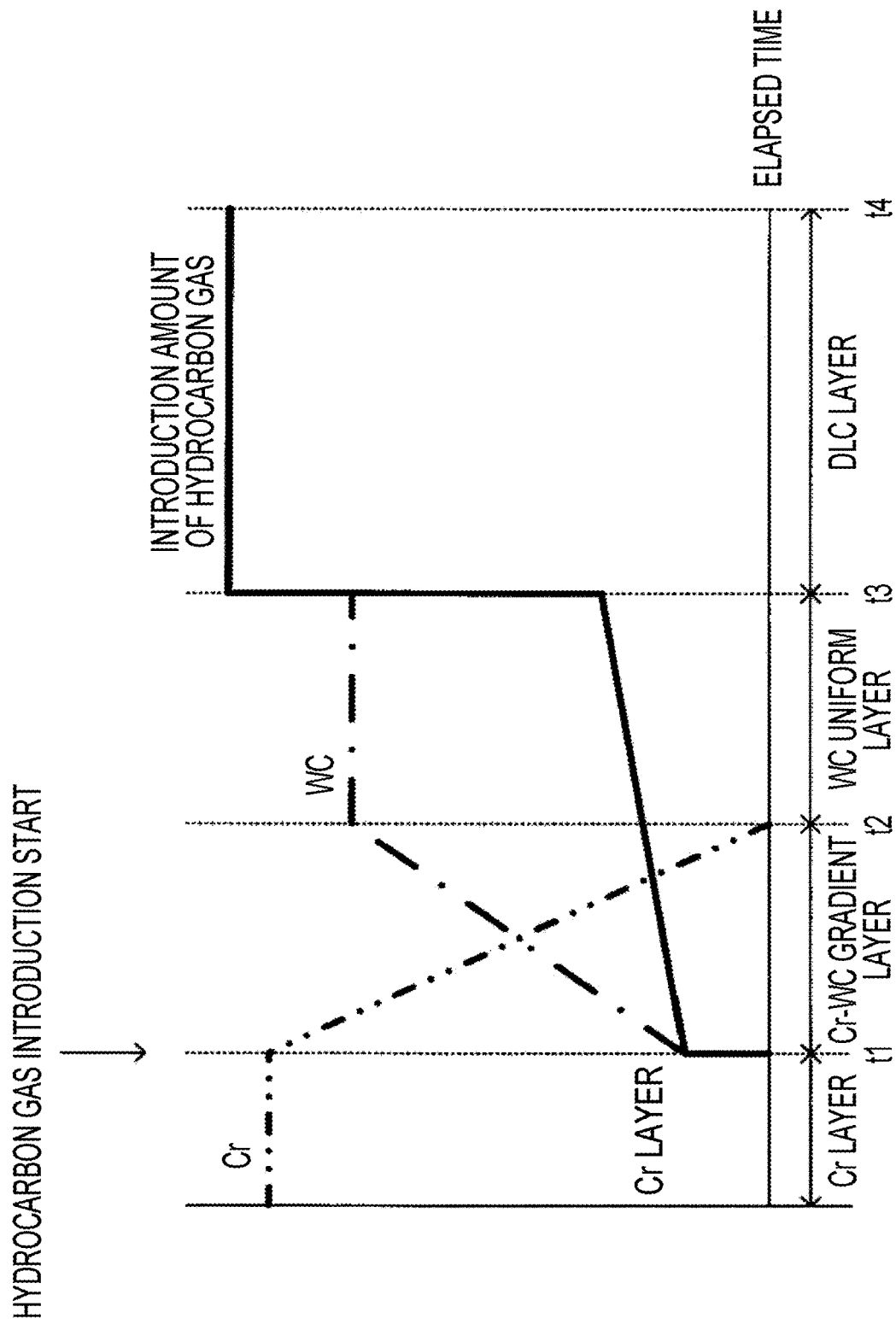
FIG. 6 is a schematic view representing an image of a production process of the low friction wear film according to the present embodiment.

FIG. 6 is a schematic view representing an image of a production process of the low friction wear film according to the present embodiment produced as described above. The horizontal axis of the graph in FIG. 6 is time. Further, the graph represented by the two-dot chain line in FIG. 6 shows an image of a temporal change in the voltage applied to the Cr target 111, the graph represented by the single-dot line in FIG. 6 shows an image of a temporal change in the voltage applied to the WC target 112, and the graph represented by the solid line in FIG. 6 shows an image of a temporal change in the introduction amount of the hydrocarbon gas.

As shown in FIG. 6, the Cr layer, the Cr—WC gradient layer, the WC uniform layer, and the DLC layer are deposited in this order with the lapse of time. In the graph of FIG. 6, the Cr layer is deposited between the start of the deposition and time t1, the Cr—WC gradient layer is deposited between time t1 and time t2, the WC uniform layer is deposited from time t2 to time t3, and the DLC layer is deposited between time t3 and time t4.

Further, during the deposition of the Cr layer, that is, between the start of the deposition and time t1, a negative voltage is applied solely to the Cr target 111. Therefore, the Cr layer is formed by the Cr atoms sputtered from the Cr target 111.

A negative voltage is applied to both the Cr target 111 and the WC target 112 during the deposition of the Cr—WC gradient layer, that is, between time t1 and time t2. Further, with the lapse of time, the voltage applied to the Cr target 111 decreases and the voltage applied to the WC target 112 increases. Therefore, the Cr—WC gradient layer is formed so as to have a gradient composition in which the composition ratio of Cr decreases and the composition ratio of WC increases as the distance from the Cr layer increases in the thickness direction. Further, at the same time as the start of the deposition of the Cr—WC gradient layer, the hydrocarbon ionization step is started and the hydrocarbon gas is introduced into the vacuum chamber 101. The introduced hydrocarbon gas is ionized in the vacuum chamber 101, and the ionized hydrocarbon is bonded with the excess W sputtered from the WC target to form WC, thereby suppressing the formation of the W-concentrated layer at the final stage of deposition of the Cr—WC gradient layer.

Further, during the deposition of the WC uniform layer, that is, between time t2 and time t3, the application of the voltage to the Cr target 111 is stopped and the negative voltage is applied solely to the WC target 112. Therefore, the WC uniform layer is formed by the WC component sputtered from the WC target 112. Further, since the hydrocarbon gas is continuously introduced during the deposition of the WC uniform layer, the excess W sputtered from the WC target 112 is bonded with the ionized hydrocarbon to form WC. This suppresses the formation of the W-concentrated layer at the initial stage of deposition of the WC uniform layer. As described above, since the formation of the W-concentrated layer at the final stage of deposition of the Cr—WC gradient layer and the initial stage of deposition of the WC uniform layer is suppressed, the W-concentrated layer is not formed at the boundary between the Cr—WC gradient layer and the WC uniform layer.

During the deposition of the WC uniform layer, the amount of W atoms sputtered from the WC target and the amount of C atoms become almost equal, and the excess W atoms are reduced, so that the C layer may be formed by the ionized hydrocarbons. In this case, the WC—C layer may be formed by the WC component sputtered from the WC target 112 and the carbon in the ionized hydrocarbon. That is, the WC layer may include the WC—C layer. In this case, the WC—C layer is formed between the Cr—WC gradient layer and the WC uniform layer and the DLC layer.

Then, during the deposition of the DLC layer, that is, between time t3 and time t4, the application of the voltage to both the Cr target and the WC target is stopped, and the introduction amount of the hydrocarbon gas is increased to a predetermined introduction amount. Further, a predetermined bias voltage is applied to the iron substrate. As a result, the hydrocarbon gas is ionized, and the DLC layer is deposited by the ionized hydrocarbon.

Figure 7:
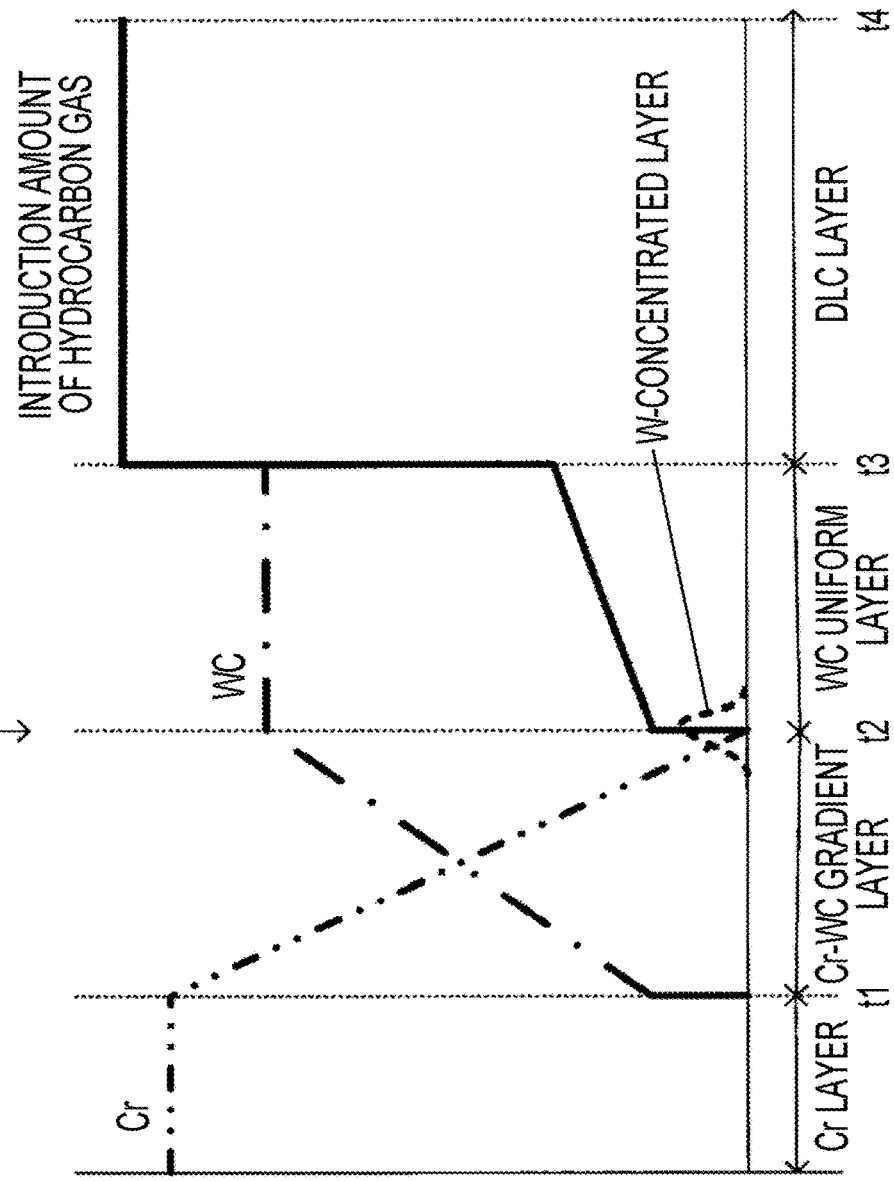
FIG. 7 is a schematic view representing an image of a production process of a low friction wear film according to a related art.

FIG. 7 is a schematic view representing an image of a production process of a low friction wear film according to a related art. The horizontal axis of the graph in FIG. 7 is time. Further, as in FIG. 6, the graph represented by the two-dot chain line, the graph represented by the single-dot chain line, and the graph represented by the solid line in FIG. 7 shows an image of a temporal change in the voltage applied to the Cr target, an image of a temporal change in the voltage applied to the WC target, and an image of a temporal change in the introduction amount of hydrocarbon gas, respectively.

The difference between the graph of FIG. 6 and the graph of FIG. 7 is just the introduction timing of the hydrocarbon gas, that is, the start timing of the hydrocarbon ionization step. In the case shown in FIG. 7, the introduction of the hydrocarbon gas (hydrocarbon ionization step) is started at the same time as the start of the WC uniform layer deposition step. Therefore, since the hydrocarbon gas is not introduced during the formation of the Cr—WC gradient layer, a W-concentrated layer is formed at the final stage of the deposition of the Cr—WC gradient layer due to the excess W generated during the deposition of the Cr—WC gradient layer. Further, although the hydrocarbon gas is introduced at the initial stage of deposition of the WC uniform layer, the amount of introduction is small, so that C is insufficient to sufficiently be bonded with the excess W generated at the initial stage of deposition of the WC uniform layer. Therefore, the W-concentrated layer is formed even at the initial stage of deposition of the WC uniform layer. Therefore, the W-concentrated layer is formed at the boundary between the Cr—WC gradient layer and the WC uniform layer. The W in the W-concentrated layer formed in this way is oxidized as described above, and the tungsten oxide reacts with the alkaline solution to cause a peeling phenomenon.

On the other hand, in the case of the present embodiment shown in FIG. 6, the introduction of the hydrocarbon gas (hydrocarbon ionization step) is started before the WC uniform layer deposition step is carried out. Specifically, the introduction of the hydrocarbon gas (hydrocarbon ionization step) is started at the same time as the start of the Cr—WC gradient layer deposition step. Therefore, in the low friction wear film according to the present embodiment, the W-concentrated layer is not formed at the boundary between the Cr—WC gradient layer and the WC uniform layer. Therefore, even when cracks occur on the film surface and the cracks reach the boundary between the Cr—WC gradient layer and the WC uniform layer, tungsten oxide is not formed because the W-concentrated layer is not present at the boundary, and the peeling phenomenon due to the reaction of tungsten oxide with the alkaline solution does not occur. Therefore, the alkali resistance of the low friction wear film according to the present embodiment is high.

EXAMPLE

Using a sputtering apparatus 100 as shown in FIG. 1, a Cr layer, a Cr—WC gradient layer, a WC uniform layer, and a DLC layer were formed in this order on the surface of a cylindrical iron substrate by the production method described above. In this case, the sputtering voltage applied to the WC target 112 and the introduction amount and introduction timing of the carbon gas were controlled so that the ratio (W/(W+C)) [%] of the atomic concentration W [at %] of W to the total (W+C) of the atomic concentration W [at %] of W and the atomic concentration C [at %] of C in the WC layer (Cr—WC gradient layer and WC uniform layer) was the ratio shown in Examples 1 to 4 and Comparative Example 1 in Table 1. As a result, samples according to Examples and Comparative Example 1 in which a low friction wear film was formed on the surface of the iron substrate were prepared. In the preparation of the samples according to Examples 1 to 4, the introduction of hydrocarbon gas (hydrocarbon ionization step) was started at the same time as the start of the Cr—WC gradient layer deposition step, and in the preparation of the sample according to Comparative Example 1, the introduction of hydrocarbon gas (hydrocarbon ionization step) was started at the same time as the start of the WC uniform layer deposition step.

Next, each of the prepared samples was immersed in a 6% alkaline aqueous solution (mixed solution of NaOH and KOH) and left in a constant temperature bath at an ambient temperature of 40° C. for 48 hours. After that, each sample was taken out from the constant temperature bath, and the presence or absence of peeling of the low friction wear film formed on the surface of the iron substrate was confirmed by visual observation and SEM. Table 1 also shows the confirmation results of the peeled state.

TABLE 1

|  | W ratio in WC layer W/(W + C) [%] | Peeled state With peeling: ○ Without peeling: X |
| --- | --- | --- |
| Example 1 | 50 | ○ |
| Example 2 | 47 | ○ |
| Example 3 | 36 | ○ |
| Example 4 | 28 | ○ |
| Comparative Example 1 | 77 | X |

As shown in Examples 1 to 4 in Table 1, when the ratio W/(W+C) was 50% or less, peeling of the film was not confirmed. It is considered that this is because when the ratio W/(W+C) in the WC layer (Cr—WC gradient layer and WC uniform layer) is 50% or less, excess W is not present in the WC layer, and thus, a W-concentrated layer in which the W simple substance is present is not formed. On the other hand, as shown in Comparative Example 1, when the ratio W/(W+C) in the WC layer was 77%, peeling of the film was confirmed. It is considered that this is because a W-concentrated layer was formed in the WC layer due to the high ratio of W in the WC layer, and peeling occurred starting from the W-concentrated layer. From this result, it was confirmed that the ratio W/(W+C) in the WC layer is preferably 50% or less.

FIGS. 8A to 8D are TEM images showing a cross section from the Cr layer to the WC uniform layer in the low friction wear film formed on the sample produced in Example 1, and a mapping image obtained by mapping the TEM image for each of the Cr component, the W component, and the C component. FIG. 8A is a TEM image, FIG. 8B is a Cr mapping image, FIG. 8C is a W mapping image, and FIG. 8D is a C mapping image. As shown in FIGS. 8A to 8D, it can be seen that the Cr layer, the Cr—WC gradient layer, and the WC uniform layer are formed from the surface of the iron substrate. Further, as can be seen from FIG. 8C, there is no portion where W is concentrated at the boundary between the Cr—WC gradient layer and the WC uniform layer. Therefore, it can be seen that the WC layer according to Example 1 includes the Cr—WC gradient layer and the WC uniform layer, and is configured such that the W-concentrated layer is not formed at the boundary the Cr—WC layer and the WC uniform layer.

FIGS. 9A to 9D are TEM images showing a cross section from the Cr layer to the WC uniform layer in the low friction wear film formed on the sample produced in Comparative Example 1, and a mapping image obtained by mapping the TEM image for each of the Cr component, the W component, and the C component. FIG. 9A is a TEM image, FIG. 9B is a Cr mapping image, FIG. 9C is a W mapping image, and FIG. 9D is a C mapping image. In particular, as shown in FIG. 9C, a layer having a high W composition ratio is detected at the boundary between the Cr—WC gradient layer and the WC uniform layer. Since almost no C component is detected in this layer, this layer is considered to be a W-concentrated layer. Therefore, it is considered that in Comparative Example 1, a W-concentrated layer was formed at the boundary between the Cr—WC gradient layer and the WC uniform layer, and peeling occurred starting from the W-concentrated layer.

In the low friction wear film, the ratio of the atomic concentration of tungsten to the total of the atomic concentration of the tungsten and the atomic concentration of carbon in the tungsten carbide layer may be 50% or less. According to the above configuration, the formation of the tungsten-concentrated layer can be suppressed by adjusting the ratio to 50% or less. When an excess carbon component is present in the tungsten carbide layer, a tungsten carbide-carbon layer is formed in the tungsten carbide layer by the carbon component and the tungsten carbide component.

In the method for producing a low friction wear film, the hydrocarbon ionization step may be started at the same time as start of the chromium-tungsten carbide gradient layer deposition step. According to the above configuration, since the ionized hydrocarbon is allowed to be sufficiently present in the vacuum chamber at the start of the tungsten carbide uniform layer deposition step, almost all of the excess tungsten generated in the WC uniform layer deposition step can be bonded with the ionized hydrocarbon, thereby suppressing formation of the tungsten-concentrated layer due to the excess tungsten generated in the initial stage of deposition of the tungsten carbide uniform layer deposition step. In addition, excess tungsten generated in the final stage of deposition of the chromium-tungsten carbide gradient layer deposition step is bonded with the ionized hydrocarbon to form tungsten carbide, thereby suppressing formation of the tungsten-concentrated layer due to the excess tungsten generated in the final stage of deposition of the chromium-tungsten carbide gradient layer deposition step.

Although the embodiments of the present disclosure have been described above, the present disclosure should not be limited to the above embodiments. For example, the low friction wear film according to an aspect of the present disclosure can be used as a coating film on the surface of the die casting mold as described above, but is not limited thereto, and can also be used as a coating film on the surface of a urea injector in which urea water is used or a linear valve for a brake in which brake fluid is used, for example, as a component used in an alkaline environment in an automobile component. Further, the production apparatus for producing the low friction wear film according to an aspect of the present disclosure is not limited to the structure of the sputtering apparatus 100 shown in the above embodiment. The present disclosure may be modified without departing from the gist thereof

What is claimed is:

1. A low friction wear film comprising:
a chromium layer provided on a surface of a metal substrate;
a tungsten carbide layer provided on a surface of the chromium layer, the tungsten carbide layer including a chromium-tungsten carbide gradient layer and a tungsten carbide uniform layer, the chromium-tungsten carbide gradient layer containing chromium and tungsten carbide and having a gradient composition in which a composition ratio of the chromium decreases and a composition ratio of the tungsten carbide increases as a distance from the chromium layer in a thickness direction increases, the tungsten carbide uniform layer being only made of tungsten carbide provided on a surface of the chromium-tungsten carbide gradient layer, and in the tungsten carbide layer, a tungsten-concentrated layer in which a tungsten simple substance is present is not provided at a boundary between the chromium-tungsten carbide gradient layer and the tungsten carbide uniform layer; and
a diamond-like carbon layer as a top layer provided on a surface of the tungsten carbide layer.

2. The low friction wear film according to claim 1, wherein a ratio of an atomic concentration of tungsten to a total of the atomic concentration of the tungsten and an atomic concentration of carbon in the tungsten carbide layer is 50% or less.

3. A method for producing the low friction wear film according to claim 1, the method comprising:
as a chromium layer deposition step, depositing the chromium layer by causing inert gas ions to collide with a chromium target made of chromium placed in a vacuum chamber to cause chromium atoms sputtered from the chromium target to adhere to the surface of the metal substrate;
as a chromium-tungsten carbide gradient layer deposition step, depositing the chromium-tungsten carbide gradient layer by causing inert gas ions to collide with the chromium target and a tungsten carbide target made of tungsten carbide placed in the vacuum chamber to cause chromium atoms sputtered from the chromium target and tungsten carbide component sputtered from the tungsten carbide target to adhere to the surface of the chromium layer;
as a tungsten carbide uniform layer deposition step, depositing the tungsten carbide uniform layer by causing inert gas ions to collide with the tungsten carbide target placed in the vacuum chamber to cause the tungsten carbide component sputtered from the tungsten carbide target to adhere to the surface of the chromium-tungsten carbide gradient layer;
as a hydrocarbon ionization step, introducing a hydrocarbon gas into the vacuum chamber and ionizing the introduced hydrocarbon gas; and
depositing the diamond-like carbon layer by causing hydrocarbon ionized in the hydrocarbon ionization step to adhere to the surface of the tungsten carbide uniform layer,
wherein the hydrocarbon ionization step is started before the tungsten carbide uniform layer deposition step is carried out.

4. The method according to claim 3, wherein the hydrocarbon ionization step is started at the same time as start of the chromium-tungsten carbide gradient layer deposition step.

* * * * *